(12) United States Patent
Cheng et al.

(10) Patent No.: US 12,431,426 B2
(45) Date of Patent: Sep. 30, 2025

(54) SEMICONDUCTOR INTERCONNECTION STRUCTURES COMPRISING A RESISTOR DEVICE AND METHODS OF FORMING THE SAME

(71) Applicant: TAIWAN SEMICONDUCTOR MANUFACTURING COMPANY, LTD., Hsinchu (TW)

(72) Inventors: Kai-Fang Cheng, Taoyuan (TW); Cherng-Shiaw Jacob Tsai, New Taipei (TW); Cheng-Chin Lee, Taipei (TW); Ming-Hsien Lin, Hsinchu (TW); Hsiao-Kang Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 842 days.

(21) Appl. No.: 17/406,785

(22) Filed: Aug. 19, 2021

(65) Prior Publication Data

US 2023/0055272 A1   Feb. 23, 2023

(51) Int. Cl.
*H01L 23/522* (2006.01)
*H01L 21/768* (2006.01)
*H01L 23/532* (2006.01)

(52) U.S. Cl.
CPC .... *H01L 23/5228* (2013.01); *H01L 21/76832* (2013.01); *H01L 21/76834* (2013.01); *H01L 21/76849* (2013.01); *H01L 23/53295* (2013.01)

(58) Field of Classification Search
CPC .......... H01L 23/5228; H01L 21/76832; H01L 21/76834; H01L 23/53295; H01L 21/76849; H01L 21/76835; H01L 21/76829; H01L 21/76838; H01L 23/64
See application file for complete search history.

(56) References Cited

U.S. PATENT DOCUMENTS

| | | | | |
|---|---|---|---|---|
| 6,309,907 B1 * | 10/2001 | Forbes | ............... | H10D 64/667 438/105 |
| 2011/0272812 A1 * | 11/2011 | Horak | ............... | H01L 23/53238 257/E21.585 |
| 2012/0139114 A1 * | 6/2012 | Zhang | ............... | H01L 21/76849 257/E23.168 |
| 2013/0118568 A1 * | 5/2013 | Ohmi | ............... | H01L 31/046 136/255 |
| 2016/0314965 A1 * | 10/2016 | Nguyen | ............ | H01L 21/02296 |
| 2018/0337125 A1 * | 11/2018 | Chen | .................. | H01L 23/3677 |
| 2019/0229062 A1 * | 7/2019 | Shin | ................ | H01L 21/76832 |
| 2020/0388567 A1 * | 12/2020 | Mignot | ............. | H01L 21/76877 |
| 2021/0028299 A1 * | 1/2021 | Liu | ........................ | H10D 30/65 |

* cited by examiner

*Primary Examiner* — Eliseo Ramos Feliciano
*Assistant Examiner* — Brad A Knudson
(74) *Attorney, Agent, or Firm* — NZ Carr Law Office

(57) ABSTRACT

An interconnection structure includes a first dielectric layer, a first conductive layer disposed in the first dielectric layer, a second dielectric layer disposed over the first dielectric layer, a second conductive layer disposed in the second dielectric layer in electrical contact with the first conductive layer, a third dielectric layer formed over the second dielectric layer, wherein the third dielectric layer comprises silicon carbon-nitride (SiCN) based material, and a resistor device disposed in the third dielectric layer.

20 Claims, 12 Drawing Sheets

ABSTRACT# SEMICONDUCTOR INTERCONNECTION STRUCTURES COMPRISING A RESISTOR DEVICE AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. The semiconductor industry continues to improve the integration density of various electronic components (e.g., transistors, diodes, resistors, capacitors, etc.) by continual reductions in minimum feature size, which allow more components to be integrated into a given area.

However, when some high resistance components are embedded in the semiconductor structure, the low thermal conductivity of the dielectric materials in the interconnection structures may cause some heat dissipation problems. For example, when forming a resistor in the back end of the line (BEOL) structures, the low thermal conductivity of interlayer dielectric (ILD) layers may prevent the heat dissipation of the resistor and cause device damages. Therefore, there is a need in the art to provide improved devices or methods that can address the issues mentioned above.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
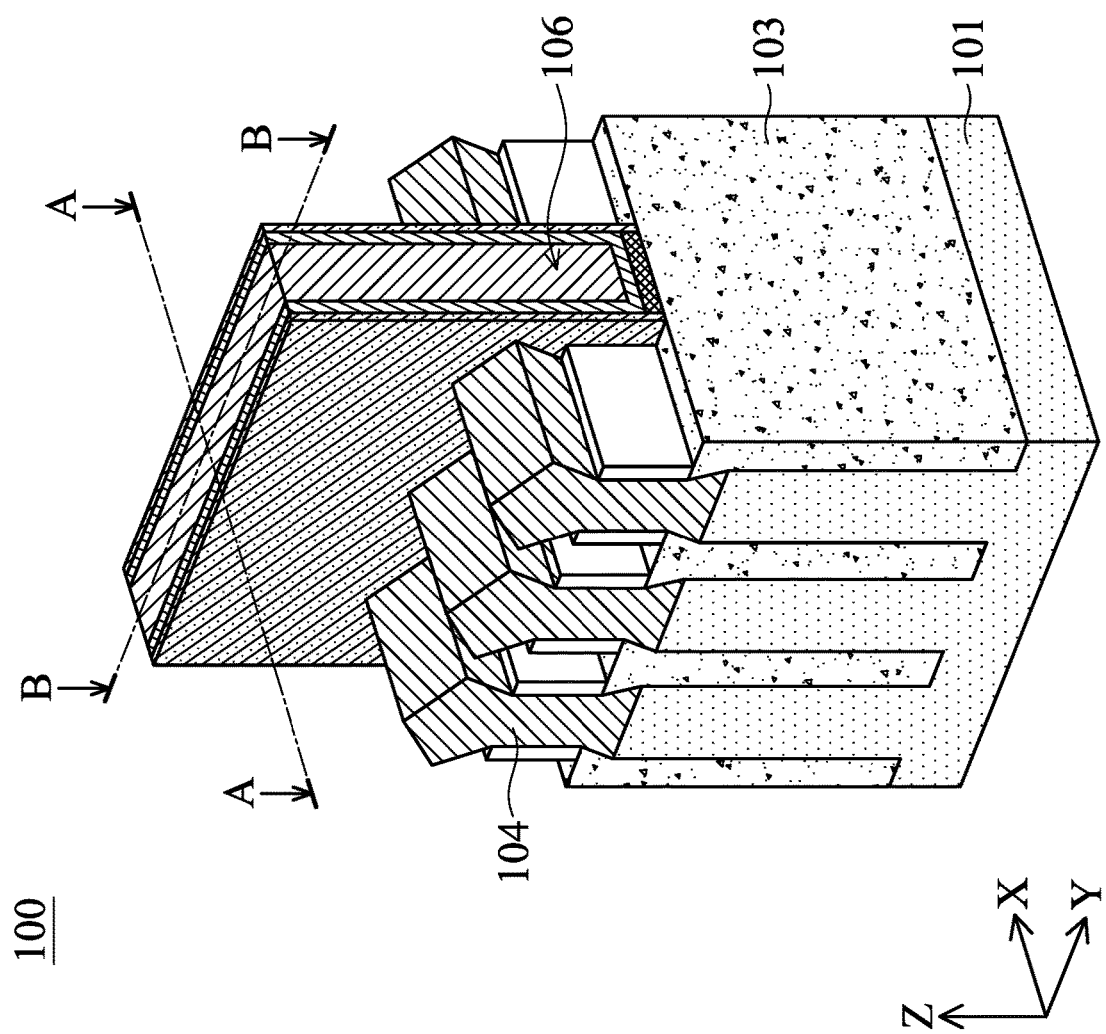
FIG. 1 is a perspective view of one of the various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a perspective view of one of the various stages of manufacturing a semiconductor device structure 100, in accordance with some embodiments. As shown in FIG. 1, the semiconductor device structure 100 includes a substrate 101 having at least a plurality of devices formed thereover. The devices, such as transistors, diodes, imaging sensors, resistors, capacitors, inductors, memory cells, a combination thereof, and/or other suitable devices, may be formed on substrate 101. In some embodiments, the interconnection structures may be formed on or below the devices.

Figure 2B:
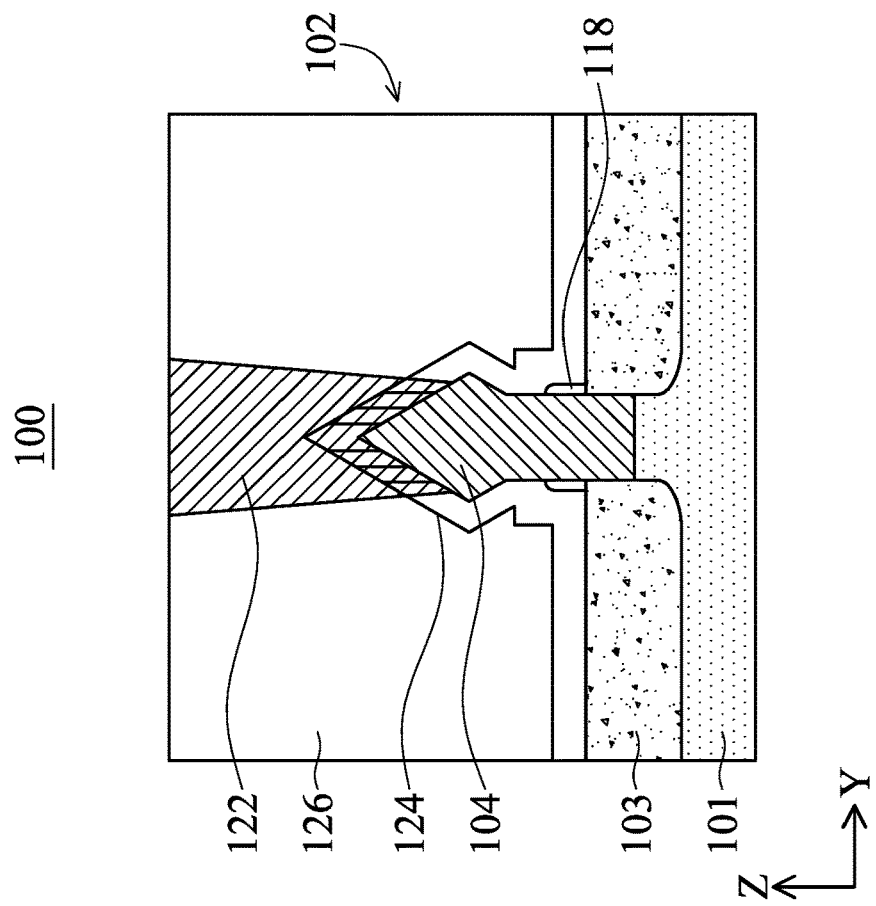
FIGS. 2A-2B are cross-sectional side views of one of various stages of manufacturing a semiconductor device structure, in accordance with some embodiments.
Figure 2A:
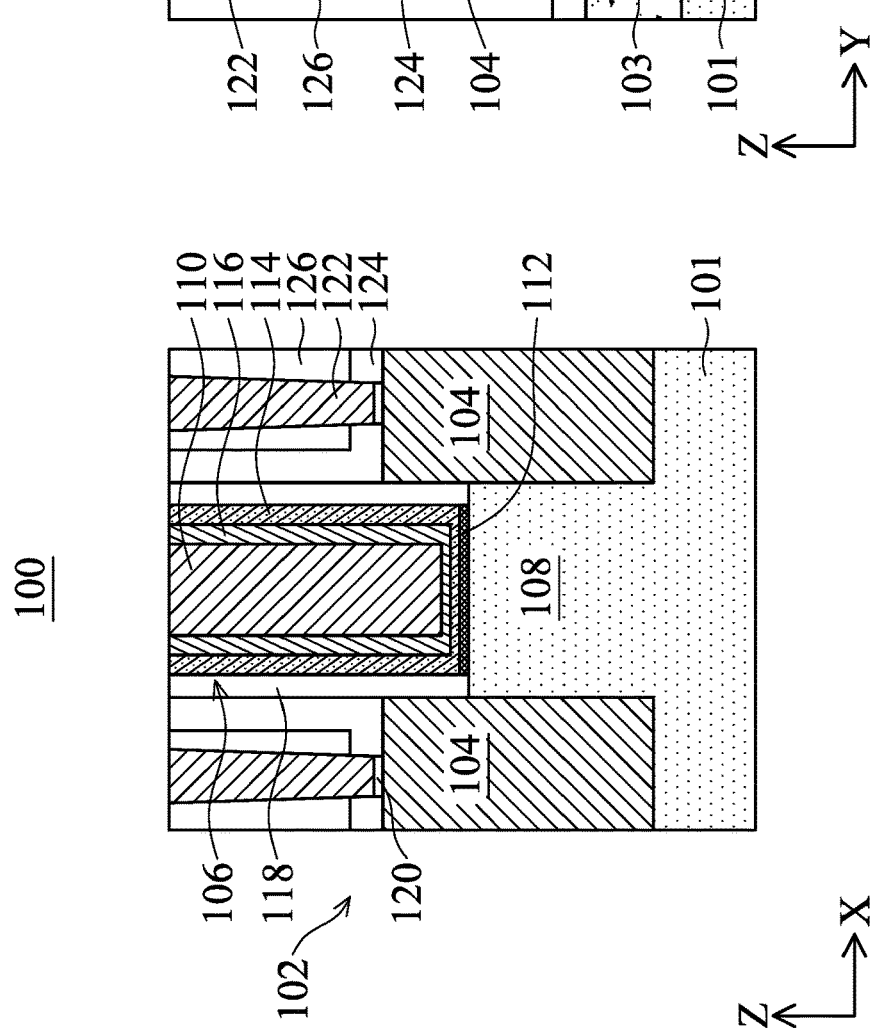

FIGS. 2A-2B are cross-sectional side views of various stages of manufacturing semiconductor device structure 100, in accordance with some embodiments. FIG. 2A is a cross-sectional side view of semiconductor device structure 100 taken along line A-A of FIG. 1, and FIG. 2B is a cross-sectional side view of semiconductor device structure 100 taken along line B-B of FIG. 1. The line A-A of FIG. 1 extends along a direction that is substantially perpendicular to the longitudinal direction of a gate stack 106, and the line B-B of FIG. 1 extends along the longitudinal direction of the gate stack 106. As shown in FIGS. 2A and 2B, semiconductor device structure 100 includes substrate 101, one or more devices 102 formed on substrate 101. The interconnection structures may be formed over devices 102.

Substrate 101 may be a semiconductor substrate. In some embodiments, substrate 101 includes a crystalline semiconductor layer on at least the surface of substrate 101. Substrate 101 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). In some embodiment, substrate 101 is made of Si. In some embodiments, substrate 101 is a silicon-on-insulator (SOI) substrate, which includes an insulating layer (not shown) disposed between two silicon layers. In one aspect, the insulating layer is an oxygen-containing material, such as an oxide.

Substrate 101 may include various regions that have been suitably doped with impurities (e.g., p-type or n-type impurities). The dopants are, for example phosphorus for an n-type fin field effect transistor (FinFET) and boron for a p-type FinFET.

As described above, devices 102 may be any suitable devices, such as transistors, diodes, imaging sensors, resistors, capacitors, inductors, memory cells, or a combination thereof. In some embodiments, devices 102 are transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. An example of device 102 formed between substrate 101 and the interconnection structures (such as the interconnection structure 200 shown in FIGS. 3-10) may be a FinFET or a nanostructure, which is shown in FIGS. 2A and 2B. An exemplary device 102 may include source/drain (S/D) regions 104 and a gate stack 106 disposed between S/D regions 104 serving as source regions and S/D regions 104 serving as drain regions. While there is only one gate stack 106 formed on substrate 101, it is contemplated that two or more gate stacks 106 may also be formed on substrate 101. Channel regions 108 are formed between S/D regions 104 serving as source regions and S/D regions 104 serving as drain regions.

S/D regions 104 may include a semiconductor material, such as Si or Ge, a III-V compound semiconductor, an II-VI compound semiconductor, or other suitable semiconductor material. Exemplary S/D region 104 may include, but are not limited to, Ge, SiGe, GaAs, AlGaAs, GaAsP, SiP, InAs, AlAs, InP, GaN, InGaAs, InAlAs, GaSb, AlP, GaP, and the like. S/D regions 104 may include p-type dopants, such as boron; n-type dopants, such as phosphorus or arsenic; and/or other suitable dopants including combinations thereof. S/D regions 104 may be formed by an epitaxial growth method using CVD, atomic layer deposition (ALD) or molecular beam epitaxy (MBE). Channel regions 108 may include one or more semiconductor materials, such as Si, Ge, GeSn, SiGe, GaAs, InSb, GaP, GaSb, InAlAs, InGaAs, GaSbP, GaAsSb, GaN, GaP, or InP. In some embodiments, channel regions 108 include the same semiconductor material as substrate 101. In some embodiments, devices 102 are FinFETs, and channel regions 108 are a plurality of fins each having at least three surfaces wrapped around by the gate stack 106. In some other embodiments, devices 102 are nanosheet transistors, and channel regions 108 are surrounded by gate stack 106.

Each gate stack 106 includes a gate electrode layer 110 disposed over channel region 108 or partially/fully surrounding channel region 108. Gate electrode layer 110 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. Each gate stack 106 may include an interfacial dielectric layer 112, a gate dielectric layer 114 disposed on interfacial dielectric layer 112, and one or more conformal layers 116 disposed on gate dielectric layer 114. Gate electrode layer 110 may be disposed on conformal layers 116. Interfacial dielectric layer 112 may include a dielectric material, such as an oxygen-containing material or a nitrogen-containing material, or multilayers thereof, and may be formed by any suitable deposition method, such as CVD, PECVD, or ALD. Gate dielectric layer 114 may include a dielectric material such as an oxygen-containing material or a nitrogen-containing material, a high-k dielectric material having a k value greater than that of silicon dioxide, or multilayers thereof. Gate dielectric layer 114 may be formed by any suitable method, such as CVD, PECVD, or ALD. Conformal layers 116 may include one or more barrier layers and/or capping layers, such as a nitrogen-containing material, for example tantalum nitride (TaN), titanium nitride (TiN), or the like. Conformal layers 116 may further include one or more work-function layers, such as aluminum titanium carbide, aluminum titanium oxide, aluminum titanium nitride, or the like. The term "conformal" may be used herein for ease of description upon a layer having substantial same thickness over various regions. Conformal layers 116 may be deposited by ALD, PECVD, MBD, or any suitable deposition technique.

One or more gate spacers 118 are formed along sidewalls of gate stack 106 (e.g., sidewalls of gate dielectric layers 114). Gate spacers 118 may include silicon oxycarbide, silicon nitride, silicon oxynitride, silicon carbon nitride, the like, multi-layers thereof, or a combination thereof, and may be deposited by CVD, PVD, ALD, or other suitable deposition technique.

Portions of gate stacks 106 and gate spacers 118 may be formed on isolation regions 103. Isolation regions 103 are formed on substrate 101. Isolation regions 103 may include an insulating material such as an oxygen-containing material, a nitrogen-containing material, or a combination thereof. The insulating material may be formed by a high-density plasma chemical vapor deposition (HDP-CVD), a flowable chemical vapor deposition (FCVD), or other suitable deposition process. In one aspect, isolation regions 103 includes silicon oxide that is formed by a FCVD process.

A contact etch stop layer (CESL) 124 is formed on a portion of S/D regions 104 and isolation region 103, and a first interlayer dielectric (ILD) 126 is formed on CESL 124. CESL 124 can provide a mechanism to stop an etch process when forming openings in first ILD 126. CESL 124 may be conformally deposited on surfaces of S/D regions 104 and isolation regions 103. CESL 124 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, PVD, ALD, or any suitable deposition technique. First ILD 126 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than silicon dioxide), and may be deposited by spin-on, CVD, FCVD, PECVD, PVD, or any suitable deposition technique.

A silicide layer 120 is formed on at least a portion of each S/D region 104, as shown in FIGS. 2A and 2B. Silicide layer 120 may include a material having one or more of WSi, CoSi, NiSi, TiSi, MoSi and TaSi. In some embodiments, silicide layer 120 includes a metal or metal alloy silicide, and the metal includes a noble metal, a refractory metal, a rare earth metal, alloys thereof, or combinations thereof. A conductive contact 122 is disposed on each silicide layer 120. Conductive contact 122 may include a material having one or more of Ru, Mo, Co, Ni. W, Ti, Ta, Cu, Al, TiN or TaN, and conductive contact 122 may be formed by any suitable method, such as electro-chemical plating (ECP), or PVD. Silicide layer 120 and conductive contact 122 may be formed by first forming an opening in first ILD 126 and CESL 124 to expose at least a portion of S/D region 104, then forming silicide layer 120 on the exposed portion of S/D region 104, and then forming conductive contact 122 on silicide layer 120.

Figure 3:
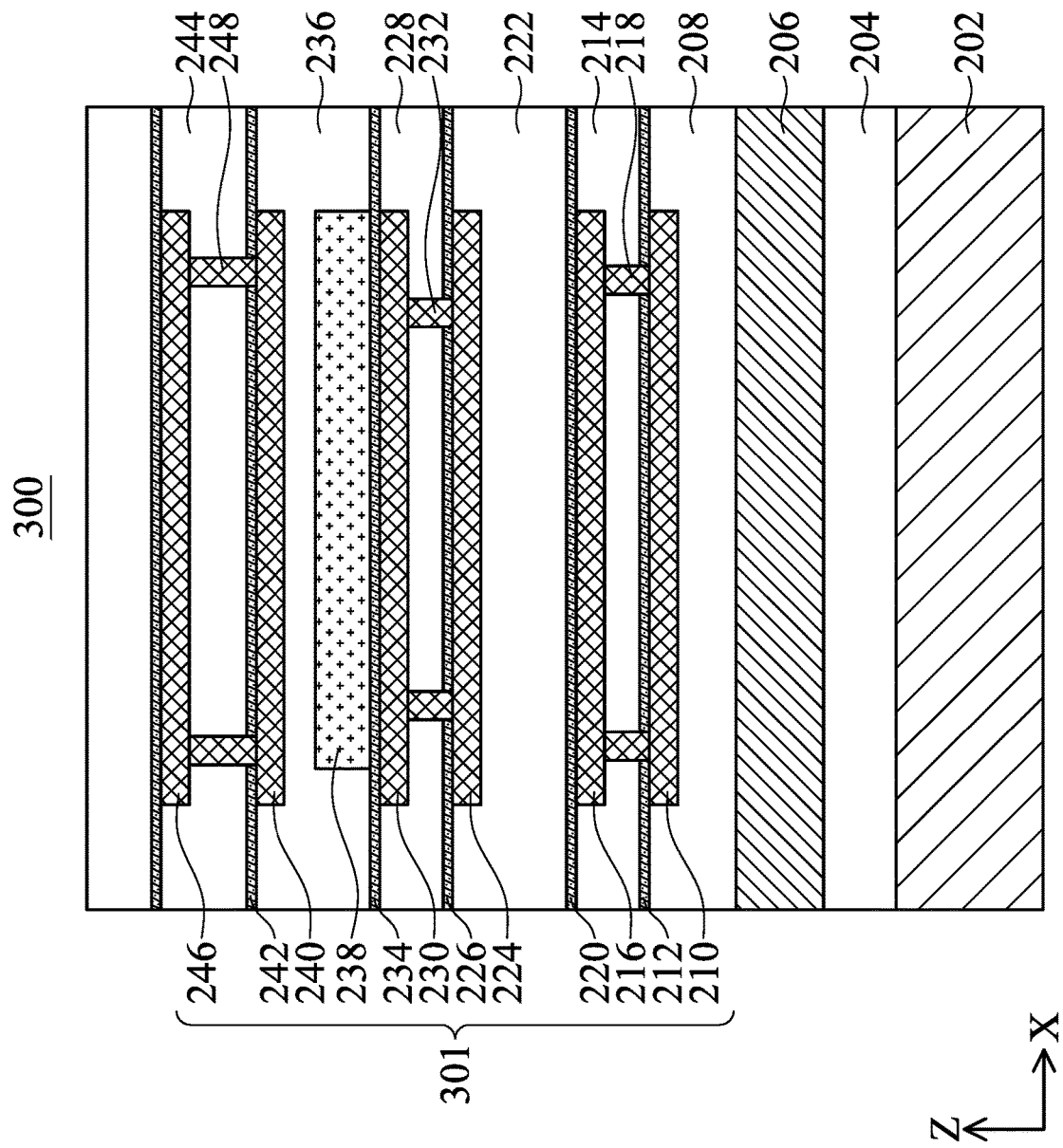
FIGS. 3-10 are cross-sectional side views of various exemplary semiconductor structures, in accordance with some embodiments.
Figure 11:
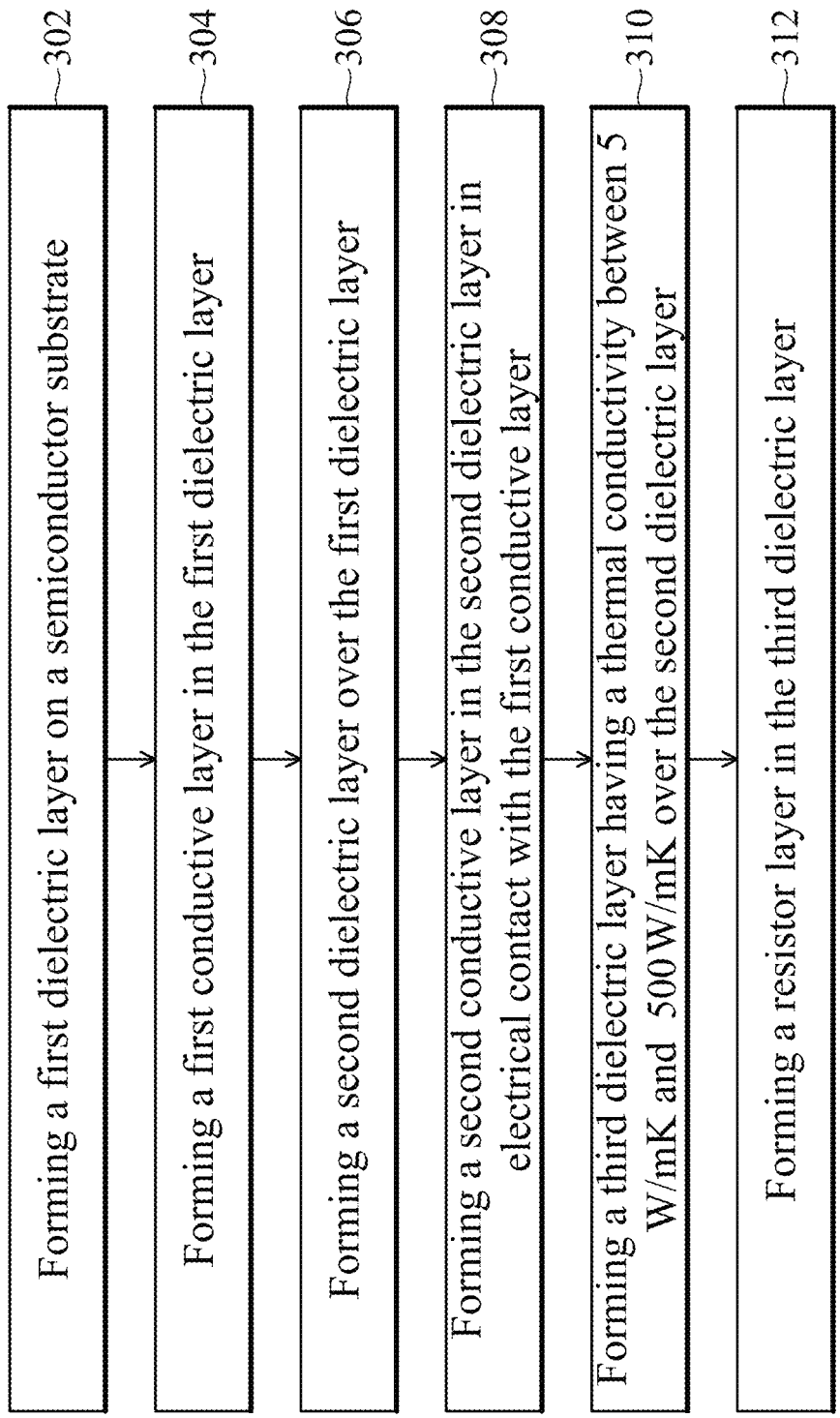
FIG. 11 is a flow chart of a method for manufacturing a semiconductor interconnection structure in accordance with some embodiments.

FIG. 3 is a cross-sectional side view of an exemplary semiconductor structure 300, including an interconnection structure 301, in accordance with some embodiments. In some embodiments, interconnection structure 301 may be formed on or below semiconductor device structure 100. FIG. 11 is a flow chart of a method 1100 for manufacturing interconnection structure 301 in accordance with some embodiments. For the purpose of better describing the present disclosure, the cross-sectional side view of semiconductor structure 300 in FIG. 3 and method 1100 in FIG. 11 will be discussed together. It is understood that the operations shown in method 1100 are not exhaustive and that other operations may be performed as well before, after, or between any of the illustrated operations. Further, some of the operations may be performed simultaneously, or in a different order than shown in FIG. 3 and FIG. 11.

As shown in FIG. 3, a semiconductor substrate 202 is provided. Semiconductor substrate 202 may be similar to substrate 101 discussed above. A plurality of devices 204 and a middle end of the line (MEOL) structure 206 may be formed on semiconductor substrate 202. In some embodiments, the plurality of devices 204 may be the devices 102 shown in FIGS. 2A and 2B.

In MEOL structure 206, low level interconnects (contacts), such as the conductive contacts 122 shown in FIGS. 2A and 2B, are formed over the S/D regions 104 and the gate electrode layer 110. MEOL structure 206 may have smaller critical dimensions and may be spaced closer together compared to the later formed BEOL counterparts. A purpose of the contact layers of MEOL structure 206 is to electrically connect the various regions of the transistors, i.e., the source/drain and metal gate electrode, to higher level interconnects in BEOL.

As shown in FIG. 3 and operation 302 in FIG. 11, a dielectric layer 208 is formed on MEOL structure 206. In some embodiments, dielectric layer 208 may include an ILD layer. In some embodiments, dielectric layer 208 may include a silicon carbon-nitride ($SiC_xN_y$) based ILD layer, where x and y may be integers or non-integers. For example, dielectric layer 208 may include carbon doped $Si_3N_4$. In another example, dielectric layer 208 may be $SiBC_xN_y$. In some embodiments, dielectric layer 208 may have a k-value between 3.5 and 5.0. In some embodiments, dielectric layer 208 may be formed at a deposition temperature between 150 degrees Celsius and 425 degrees Celsius by CVD, PVD, ALD, spin coating, or other suitable processes. In some embodiments, dielectric layer 208 may be formed with or without additional anneal or ultraviolet (UV) curing process.

As shown in FIG. 3 and operation 304 in FIG. 11, a conductive layer 210 is formed in dielectric layer 208. In some embodiments, conductive layer 210 may include Cu, Ni, Co, Ru, Ir, Al, Pt, Pd, Au, Ag, Os, W, Mo and related alloys. In some embodiments, conductive layer 210 may be formed at a deposition temperature between 150 degrees Celsius and 425 degrees Celsius by ALD, CVD, PVD, electroless deposition (ELD), ECP, or other suitable processes.

In some embodiments, one or more etch stop layers (ESL) 212 may be formed over dielectric layer 208 and conductive layer 210, as shown in FIG. 3. ESL 212 may be used when later forming conductive features 218 in a dielectric layer 214 to control the etching depth in dielectric layer 214. In some embodiments, ESL 212 may include $SiO_x$, $SiO_xC_yH_z$, $SiC_x$, $SiO_xC_y$, $SiN_x$, $SiC_xN_y$, $AlN_x$, $AlO_x$, $AO_xN_y$, or with doped Hf, Zr or Y, or other suitable materials. ESL 212 and dielectric layer 208 include different materials. In some embodiments, ESL 212 may be formed at a deposition temperature between 150 degrees Celsius and 425 degrees Celsius by CVD, PVD, ALD, spin coating, or other suitable processes.

As shown in FIG. 3 and operation 306 in FIG. 11, dielectric layer 214 is formed over ESL 212. In some embodiments, dielectric layer 214 may include the materials same with dielectric layer 208. In some embodiments, dielectric layer 214 may be formed by processes similar to forming dielectric layer 208. As shown in FIG. 3 and operation 308 in FIG. 11, a conductive layer 216 is formed in dielectric layer 214 in electrical contact with conductive layer 210 through conductive feature 218. In some embodiments, conductive features 216, 218 may be formed in dielectric layer 214 by dual damascene, single damascene, semi damascene, or other suitable processes.

By using the single damascene process as an example, ESL 212 is formed over dielectric layer 208 and conductive layer 210, and dielectric layer 214 is formed over ESL 212. Then, an etch process may be performed to form the openings according to the predefined patterns. In some embodiments, a barrier layer (not shown) may be deposited in the openings, and a conductive material, such as Cu, is deposited on the barrier layer. The deposition of the conductive material on the barrier layer in the openings may include forming a seed layer on the barrier layer by PVD process and then forming the conductive material on the seed layer by electrodeposition process. The conductive material may form conductive feature 218 in the openings. In some embodiments, by using dual damascene process, conductive layer 216 may be further formed on conductive feature 218. The top surface of the conductive material is then planarized so that top surfaces of conductive layer 216 and dielectric layer 214 are substantially co-planar.

It is understood that, in some embodiments, more than one stack of interconnection layers, e.g., dielectric layer 208, ESL 212, and dielectric layer 214, including conductive layer 210, conductive layer 216, and conductive feature 218 formed therein, may be formed over MEOL structure 206. For example, as shown in FIG. 3, an ESL 220 is formed over dielectric layer 214 and conductive layer 216. A dielectric layer 222 is formed over ESL 220, and a conductive layer 224 is formed in dielectric layer 222. An ESL 226 is formed over dielectric layer 222 and conductive layer 224, and a dielectric layer 228 is formed over ESL 226. Then, a conductive layer 230 is formed in dielectric layer 228 in electrical contact with conductive layer 224 through conductive features 232. In some embodiments, conductive layer 230 and conductive feature 232 may be formed in dielectric layer 228 by dual damascene, single damascene, semi damascene, or other suitable processes. The materials and the manufacturing processes of dielectric layer 222, conductive layer 224, ESL 226, dielectric layer 228, conductive layer 230, and conductive feature 232 may be similar to the materials and manufacturing processes of dielectric layer 208, conductive layer 210, ESL 212, dielectric layer 214, conductive layer 216, and conductive feature 218, respectively.

An ESL 234 is formed over dielectric layer 228 and conductive layer 230, and a dielectric layer 236 is formed over ESL 234, as shown in operation 310 in FIG. 11. A resistor device 238 is then formed in dielectric layer 236, as shown in operation 312 in FIG. 11. In some embodiments, resistor device 238 may be a high-resistance layer covered by dielectric layers.

Figure 12:
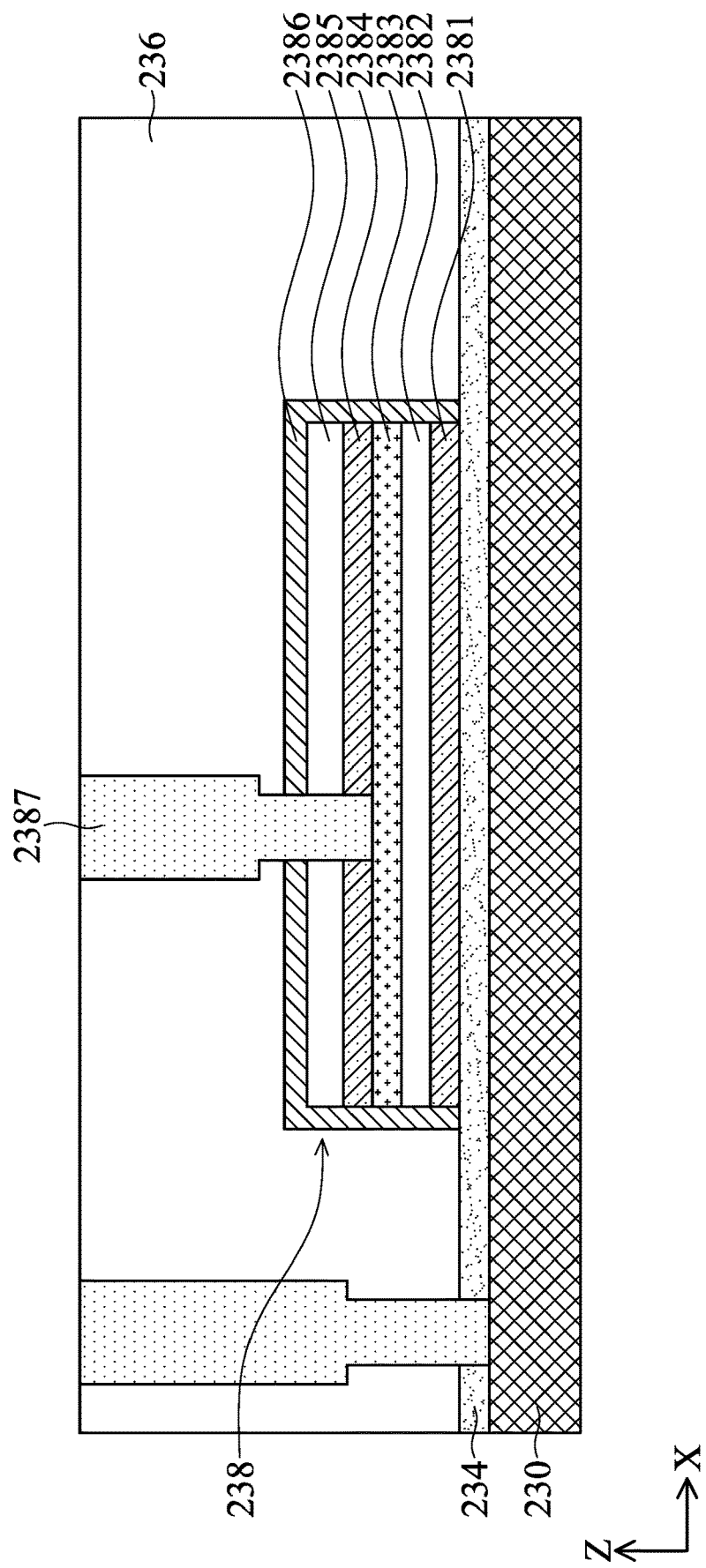
FIG. 12 is a cross-sectional side view of a resistor device at one of various stages of manufacturing a semiconductor interconnection structure, in accordance with some embodiments.

FIG. 12 is a cross-sectional side view of resistor device 238 at one of various stages of manufacturing the semiconductor structure 300, in accordance with some embodiments. As show in FIG. 12, resistor device 238 may include a first silicide-blocking layer (SBL) 2381, a first oxide layer 2382, a high resistance material layer 2383, a second SBL 2384, and a second oxide layer 2385. In some embodiments, the stack of first SBL 2381, first oxide layer 2382, high resistance material layer 2383, second SBL 2384, and second oxide layer 2385 may be further covered by a third oxide layer 2386. In some embodiments, the stack of first SBL 2381, first oxide layer 2382, high resistance material layer 2383, second SBL 2384, and second oxide layer 2385 may be sequentially deposited on ESL 234, and then patterned by lithography and etch operations. In some embodiments, high resistance material layer 2383 may include TiN, TaN, or other suitable materials. In some embodiments, the first, second, and third oxide layers 2382, 2385, 2386 may be silicon oxide layers formed using tetraethyl orthosilicate (TEOS) as a precursor. In some embodiments, each of first SBL 2381 and second SBL 2384 may have a thickness between 50 Angstrom and 200 Angstrom. In some embodiments, each of first oxide layer 2382 and second oxide layer 2385 may have a thickness between 50 Angstrom and 200 Angstrom. In some embodiments, third oxide layer 2386 may have a thickness between 20 Angstrom and 100 Angstrom. FIG. 12 describes resistor device 238 formed on ESL 234, and it is understood that resistor device 238 may further extend in other directions, e.g., in x-direction or y-direction, and have a via structure 2387 in contact with high resistance material layer 2383 at the extended portions.

Dielectric layer 236 may include an ILD layer. In some embodiments, dielectric layer 236 may include a $SiC_xN_y$ based ILD layer. For example, dielectric layer 236 may include carbon doped $Si_3N_4$. For another example, dielectric layer 236 may be $SiBC_xN_y$. In some embodiments, dielectric layer 236 may have a k-value between 2.0 and 5.0. In some embodiments, dielectric layer 236 may have a k-value between 3.5 and 5.0. In some embodiments, dielectric layer 236 may be formed at a deposition temperature between 150 degrees Celsius and 425 degrees Celsius by CVD, PVD, ALD, spin coating, or other suitable processes. In some embodiments, dielectric layer 236 may be formed with or without additional anneal or UV curing process. In some embodiments, the materials and the manufacturing processes of dielectric layer 236 may be similar to those of dielectric layer 222 or dielectric layer 228. In some embodiments, the materials and the manufacturing processes of dielectric layer 236 may be different from those of dielectric layer 222 or dielectric layer 228.

Dielectric layer 236 includes material having a thermal conductivity between 5 W/mK and 500 W/mK, and therefore can quickly dissipate the heat generated by resistor device 238, avoiding the accumulation of heat inside the semiconductor structure 300. For example, when dielectric layer 236 includes carbon doped $Si_3N_4$, the thermal conductivity of carbon doped $Si_3N_4$ may be between 200 W/mK and 400 W/mK, and the k-value may be between 2.0 and 5.0, that not only provides increased thermal conductivity but also has low dielectric constant for the semiconductor structure 300. Hence, local heat damage in semiconductor structure 300 can be prevented.

It is understood that, in some embodiments, one or more stacks of interconnection layers may be further formed over dielectric layer 236. For example, as shown in FIG. 3, a conductive layer 240 is formed in dielectric layer 236. An ESL 242 is formed over dielectric layer 236 and conductive layer 240, and a dielectric layer 244 is formed over ESL 242. Then, a conductive layer 246 is formed in dielectric layer 244 in electrical contact with conductive layer 240 through a conductive feature 248. In some embodiments, conductive layer 246 and conductive feature 248 may be formed in dielectric layer 244 by dual damascene, single damascene, semi damascene, or other suitable processes. The materials and the manufacturing processes of ESL 242, dielectric layer 244, conductive layer 246, and conductive feature 248 may be similar to the materials and manufacturing processes of ESL 212, dielectric layer 214, conductive layer 216, and conductive feature 218, respectively. In some embodiments, resistor device 238 may be electrically isolated with conductive layer 240, and resistor device 238 is in contact with other conductive layers through via structure 2387. In some embodiments, resistor device 238 may be electrically connected to conductive layer 240 through via structure 2387.

Figure 4:
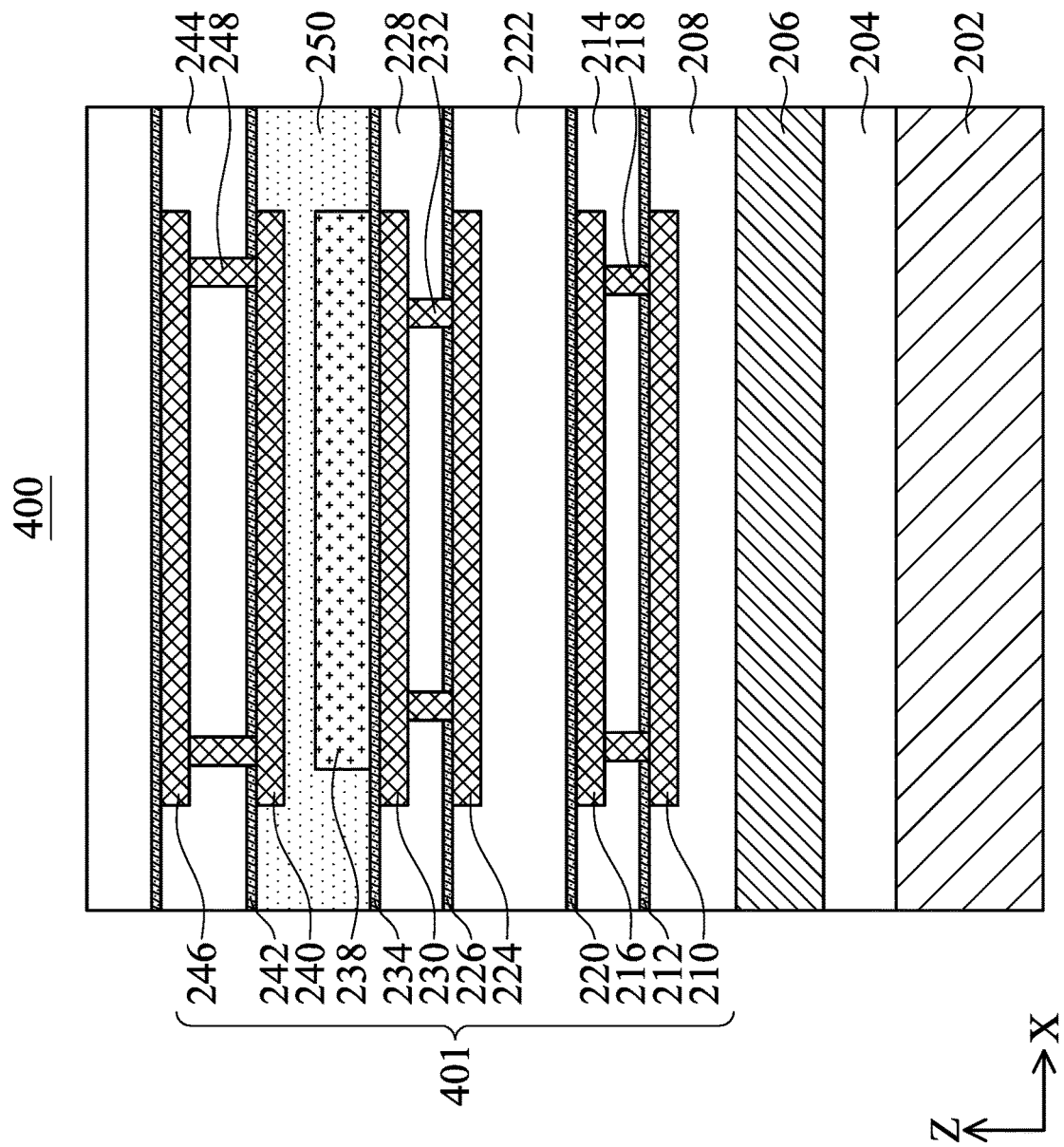

FIG. 4 is a cross-sectional side view of another exemplary semiconductor structure 400, including an interconnection structure 401, in accordance with some embodiments. The structure and materials of layers of semiconductor structure 400 are similar to those of semiconductor structure 300. The difference of semiconductor structure 400 is the material and the manufacturing processes of a dielectric layer 250 having resistor device 238 formed therein. In some embodiments, the structure and materials of resistor device 238 in FIG. 4 may be the same or similar to resistor device 238 in FIG. 12.

As shown in FIG. 4, dielectric layer 250 is formed over ESL 234. Dielectric layer 250 may include an ILD layer. In some embodiments, dielectric layer 250 may include a crystalline $SiC_xO_y$ based ILD layer. In some embodiments, dielectric layer 250 may have a k-value between 1.0 and 5.0. In some embodiments, dielectric layer 250 may have a k-value between 2.0 and 5.0. In some embodiments, dielectric layer 250 may be formed at a deposition temperature between 150 degrees Celsius and 425 degrees Celsius by CVD, PVD, ALD, spin coating, or other suitable processes. In some embodiments, dielectric layer 250 may be formed with or without additional anneal or UV curing process.

Dielectric layer 250 includes material having a thermal conductivity between 5 W/mK and 500 W/mK, and therefore can quickly dissipate the heat generated by resistor device 238 to the outside of the component, avoiding the accumulation of heat inside the component. For example, when dielectric layer 250 includes crystalline $SiC_xO_y$ based ILD layer, the thermal conductivity of crystalline $SiC_xO_y$ may be between 200 W/mK and 400 W/mK, and the k-value may be between 2.0 and 5.0, that not only provides improved thermal conductivity but also has low dielectric constant for the semiconductor structure 400. Hence, reliability and efficiency of the semiconductor structure 400 are improved.

Figure 5:
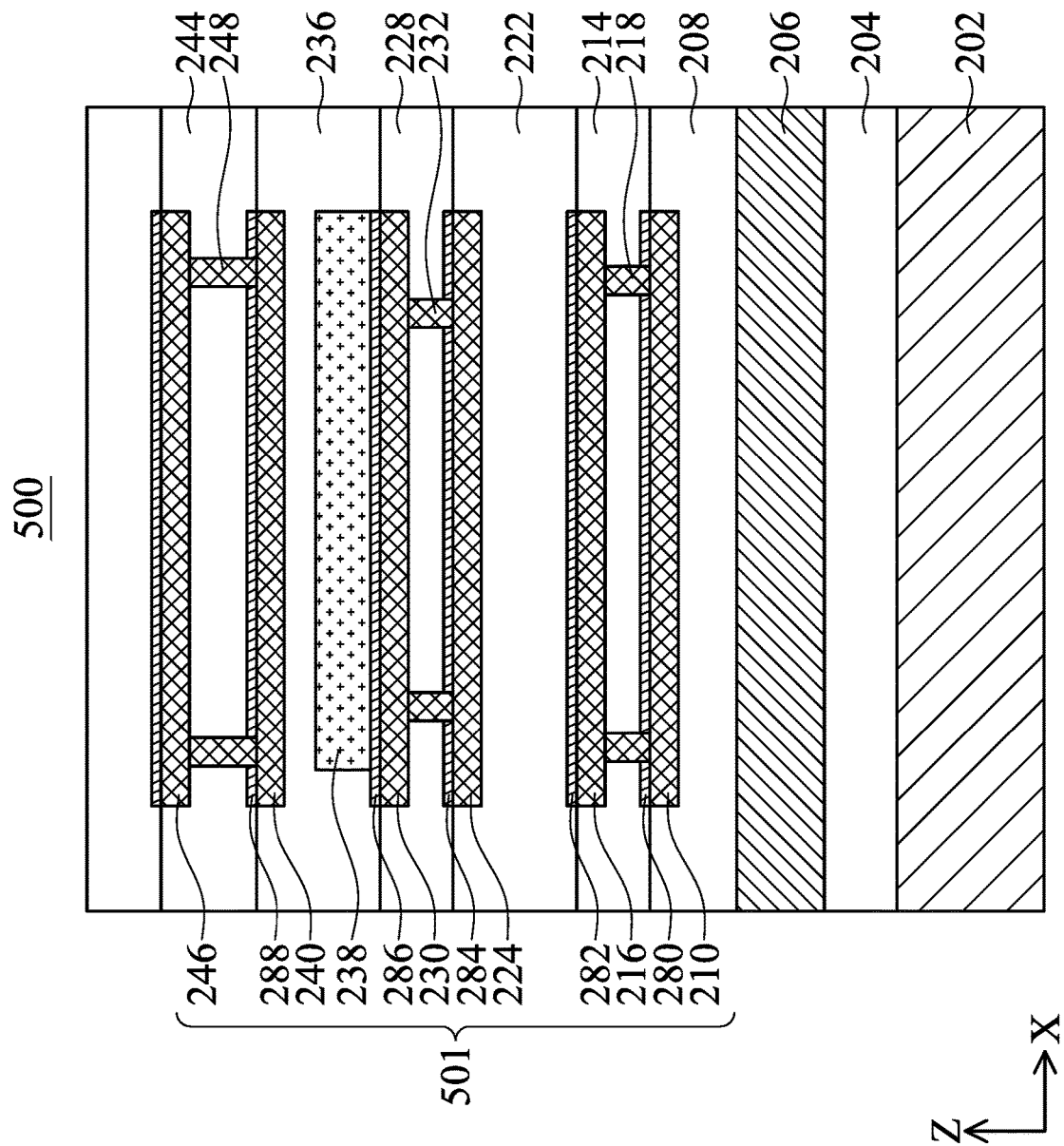

FIG. 5 is a cross-sectional side view of a further exemplary semiconductor structure 500, including an interconnection structure 501, in accordance with some embodiments. The structure and materials of layers of semiconductor structure 500 are similar to those of semiconductor structure 300. The difference of semiconductor structure 500 is that semiconductor structure 500 is an ESL-free structure, for example without ESLs 212, 220, 226, 234, 242 shown in FIGS. 3 and 4. In some embodiments, the structure and materials of resistor device 238 in FIG. 5 may be the same or similar to resistor device 238 in FIG. 12.

After operation 304 in FIG. 11 that forming conductive layer 210 in dielectric layer 208, a cap layer 280 may be selectively formed over conductive layer 210, as shown in FIG. 5. In some embodiments, cap layer 280 may include graphene. In some embodiments, cap layer 280 may include $Si_xN_y$. In some embodiments, cap layer 280 may be selectively deposited on conductive layer 210 at a deposition temperature between 150 degrees Celsius and 425 degrees Celsius by ALD, CVD, or other suitable processes.

For example, a plasma treatment may be applied to the surface of dielectric layer 208 and conductive layer 210 to remove the metal oxide formed on the upper surface of conductive layer 210 and promote cap layer 280, such as graphene, to be deposited easily. The plasma treatment may also modify the surface of dielectric layer 208 such that a graphene growth is suppressed on the surface of dielectric layer 208. Accordingly, it is possible to selectively deposit graphene on conductive layer 210, e.g., Cu, only. During the plasma treatment, the substrate temperature is maintained at a temperature in a range from about 25 degrees Celsius (room temperature) to about 425 degrees Celsius. In some embodiments, the input power of the plasma is in a range from about 100 W to about 1000 W.

The plasma treatment may include single or multi-step processes, each of which may contain hydrogen-based gas, ammonia-based gas or argon-based gas. In some embodiments, a self-assembled monolayer (SAM) (not shown) is formed on the surface of dielectric layer 208, which can further suppress the deposition of the graphene layer. The SAM may be made of a silane-based material, a phosphate-based material, an amine-based material and/or a thiol-based material. In some embodiments, the plasma treatment may be omitted.

After the plasma treatment, cap layer 280, e.g., graphene, is selectively formed on the surface of conductive layer 210. In some embodiments, the graphene layer can be formed by thermal CVD or plasma CVD using one or more of methane gas, ethane gas, propane gas or other hydrocarbon gas, together with hydrogen gas. The graphene layer may be a monolayer or a multilayer structure. Since the underlying metal, such as Cu or Ni, promotes the growth of graphene layer, the graphene layer can be selectively formed on the surface of conductive layer 210. During the graphene formation process, the substrate temperature is maintained at a temperature in a range between 150 degrees Celsius and 425 degrees Celsius.

As shown in FIG. 5, a cap layer 282 may be selectively formed on conductive layer 216, a cap layer 284 may be selectively formed on conductive layer 224, a cap layer 286 may be formed on selectively conductive layer 230, and a cap layer 288 may be selectively formed on conductive layer 240. Cap layers 282, 284, 286, 288 may include the same material as cap layer 280 and formed by the same processes as the cap layer 280. By forming the cap layers 280, 282, 284, 286 and 288 on the conductive layers 210, 216, 224, 230 and 240, respectively, the etch stop layers between dielectric layers, such as ESLs 212, 220, 226, 234, 242 shown in FIGS. 3 and 4, can be omitted, and cap layers 280, 282, 284, 286 and 288 function as etch stop layers.

Figure 6:
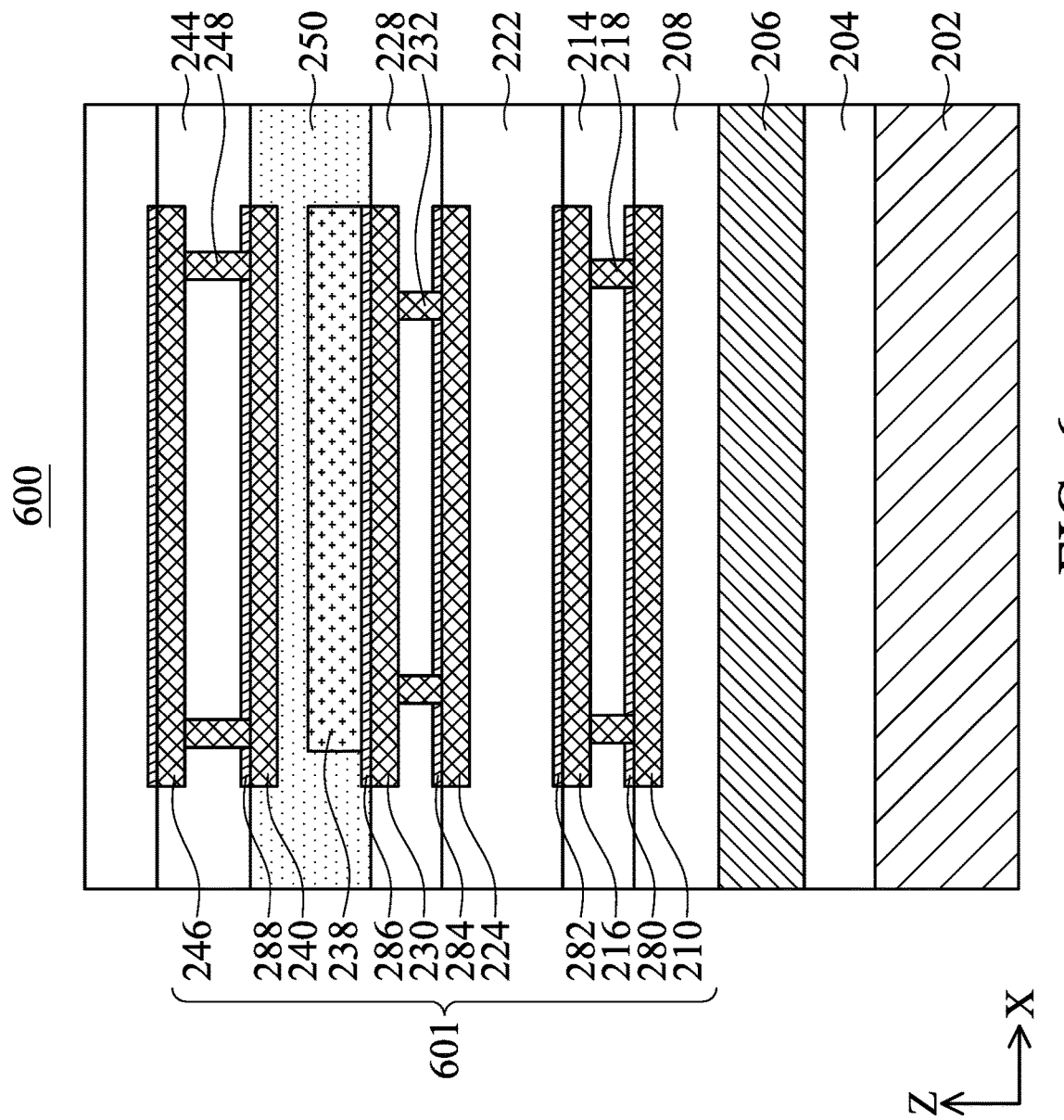

FIG. 6 is a cross-sectional side view of a further exemplary semiconductor structure 600, including an interconnection structure 601, in accordance with some embodiments. The structure and materials of layers of semiconductor structure 600 are similar to those of semiconductor structure 500. Comparing to semiconductor structure 500, the difference of semiconductor structure 600 is the material and the manufacturing processes of dielectric layer 250 having resistor device 238 formed therein instead of dielectric layer 236 having resistor device 238 formed therein. In some embodiments, the structure and materials of resistor device 238 in FIG. 6 may be the same or similar to resistor device 238 in FIG. 12.

As shown in FIG. 6, dielectric layer 250 is formed over dielectric layer 228 and cap layer 286. Dielectric layer 250 may include an ILD layer. In some embodiments, dielectric layer 250 may include a crystalline $SiC_xO_y$ based ILD layer.

In some embodiments, dielectric layer 250 may have a k-value between 1.0 and 5.0. In some embodiments, dielectric layer 250 may have a k-value between 2.0 and 5.0. In some embodiments, dielectric layer 250 may be formed at a deposition temperature between 150 degrees Celsius and 425 degrees Celsius by CVD, PVD, ALD, spin coating, or other suitable processes. In some embodiments, dielectric layer 250 may be formed with or without additional anneal or UV curing process.

Dielectric layer 250 includes material having a thermal conductivity between 5 W/mK and 500 W/mK, and therefore can quickly dissipate the heat generated by resistor device 238 to the outside of the component, avoiding the accumulation of heat inside the component. For example, when dielectric layer 250 includes crystalline $SiC_xO_y$ based ILD layer, the thermal conductivity of crystalline $SiC_xO_y$ may be between 200 W/mK and 400 W/mK, and the k-value may be between 2.0 and 5.0, that not only provides improved thermal conductivity but also has low dielectric constant for the semiconductor devices. Hence, reliability and efficiency of the semiconductor structure 600 are improved.

Figure 7:
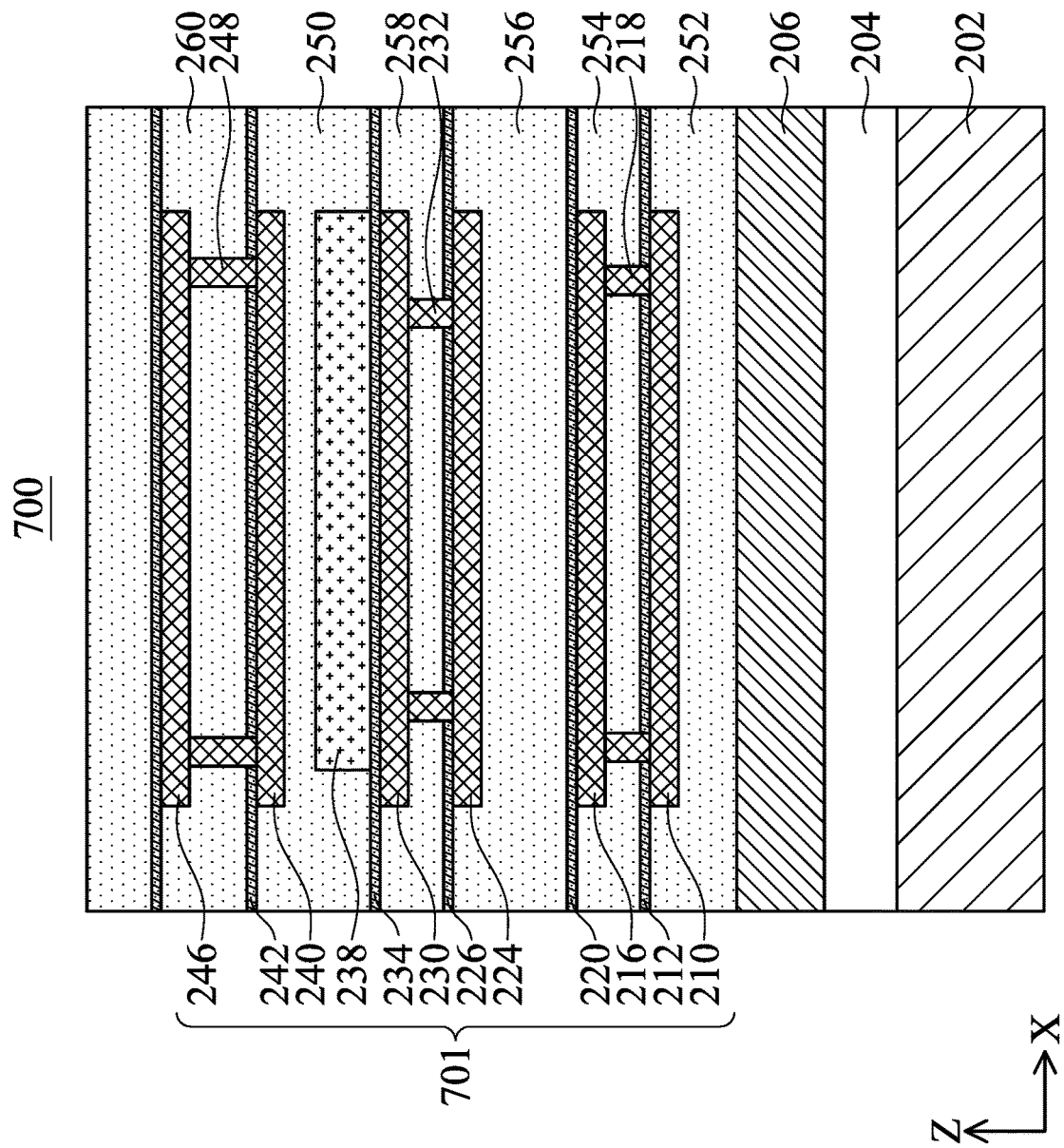

FIG. 7 is a cross-sectional side view of a further exemplary semiconductor structure 700, including an interconnection structure 701, in accordance with some embodiments. As shown in FIG. 7, a dielectric layer 252 is formed over MEOL structure 206. In some embodiments, dielectric layer 252 may include an ILD layer. In some embodiments, dielectric layer 252 may include a crystalline $SiC_xO_y$ based ILD layer. In some embodiments, dielectric layer 252 may have a k-value between 1.0 and 5.0. In some embodiments, dielectric layer 252 may have a k-value between 2.0 and 5.0. In some embodiments, dielectric layer 252 may be formed at a deposition temperature between 150 degrees Celsius and 425 degrees Celsius by CVD, PVD, ALD, spin coating, or other suitable processes. In some embodiments, dielectric layer 252 may be formed with or without additional anneal or UV curing process. In some embodiments, the dielectric layer 252 includes the same material as the dielectric layer 250.

Conductive layer 210 is formed in dielectric layer 252. In some embodiments, the material and manufacturing process of conductive layer 210 of semiconductor structure 700 may be similar to conductive layer 210 of semiconductor structure 300. One or more ESLs 212 may be formed over dielectric layer 252 and conductive layer 210. ESL 212 may be used when later forming conductive features 218 in a dielectric layer 254 to control the etching depth in dielectric layer 254. In some embodiments, the material and manufacturing process of ESL 212 of semiconductor structure 700 may be similar to ESL 212 of semiconductor structure 300.

Dielectric layer 254 is formed over ESL 212. In some embodiments, dielectric layer 254 may include the same material as the dielectric layer 252. In some embodiments, dielectric layer 254 may be formed by processes similar to forming dielectric layer 252. A conductive layer 216 is formed in dielectric layer 254 in electrical contact with conductive layer 210 through conductive features 218. In some embodiments, the material and manufacturing process of conductive layer 216 of semiconductor structure 700 may be similar to conductive layer 216 of semiconductor structure 300. In some embodiments, the material and manufacturing process of conductive feature 218 of semiconductor structure 700 may be similar to conductive feature 218 of semiconductor structure 300.

It is understood that, in some embodiments, more than one stack of interconnection layers, e.g., dielectric layer 252, ESL 212, and dielectric layer 254, including conductive layer 210, conductive layer 216, and conductive feature 218 formed therein, may be formed over MEOL structure 206. For example, as shown in FIG. 7, ESL 220 is formed over dielectric layer 254 and conductive layer 216. A dielectric layer 256 is formed over ESL 220, and conductive layer 224 is formed in dielectric layer 256. ESL 226 is formed over dielectric layer 256 and conductive layer 224, and a dielectric layer 258 is formed over ESL 226. Then, conductive layer 230 is formed in dielectric layer 258 in electrical contact with conductive layer 224 through a conductive feature 232. The materials and the manufacturing processes of dielectric layer 256, conductive layer 224, ESL 226, dielectric layer 258, conductive layer 230, and conductive feature 232 may be similar to the materials and manufacturing processes of dielectric layer 252, conductive layer 210, ESL 212, dielectric layer 254, conductive layer 216, and conductive feature 218, respectively.

ESL 234 is formed over dielectric layer 258 and conductive layer 230, and dielectric layer 250 is formed over ESL 234. Resistor device 238 is then formed in dielectric layer 250. In some embodiments, the structure and materials of resistor device 238 in FIG. 7 may be the same or similar to resistor device 238 in FIG. 12.

Dielectric layer 250 may include an ILD layer. In some embodiments, dielectric layer 250 may include a crystalline $SiC_xO_y$ based ILD layer. In some embodiments, dielectric layer 250 may have a k-value between 1.0 and 5.0. In some embodiments, dielectric layer 250 may have a k-value between 2.0 and 5.0. In some embodiments, dielectric layer 250 may be formed in the temperature between 425 degrees Celsius and 150 degrees Celsius by CVD, PVD, ALD, spin coating, or other suitable processes. In some embodiments, dielectric layer 250 may be formed with or without additional anneal or UV curing process. In some embodiments, $Si(CH_3)_4$, $(CH_3)_3SiH$, and/or $CO_2$ may be used as the precursor when forming the crystalline $SiC_xO_y$ based ILD layer (dielectric layer 250).

Dielectric layer 250 includes material having a thermal conductivity between 5 W/mK and 500 W/mK, and therefore can quickly dissipate the heat generated by resistor device 238 to the outside of the component, avoiding the accumulation of heat inside the component. For example, when dielectric layer 250 includes crystalline $SiC_xO_y$ based ILD layer, the thermal conductivity of crystalline $SiC_xO_y$ may be between 200 W/mK and 400 W/mK, and the k-value may be between 2.0 and 5.0, that not only provides improved thermal conductivity but also has low dielectric constant for the semiconductor devices. Hence, reliability and efficiency of the interconnection structure 700 are improved.

It is understood that, in some embodiments, one or more stacks of interconnection layers may be further formed over dielectric layer 250. For example, as shown in FIG. 7, conductive layer 240 is formed in dielectric layer 250. ESL 242 is formed over dielectric layer 250 and conductive layer 240, and a dielectric layer 260 is formed over ESL 242. Then, conductive layer 246 is formed in dielectric layer 260 in electrical contact with conductive layer 240 through a conductive feature 248. In some embodiments, conductive layer 246 and conductive feature 248 may be formed in dielectric layer 260 by dual damascene, single damascene, semi damascene, or other suitable processes.

Figure 8:
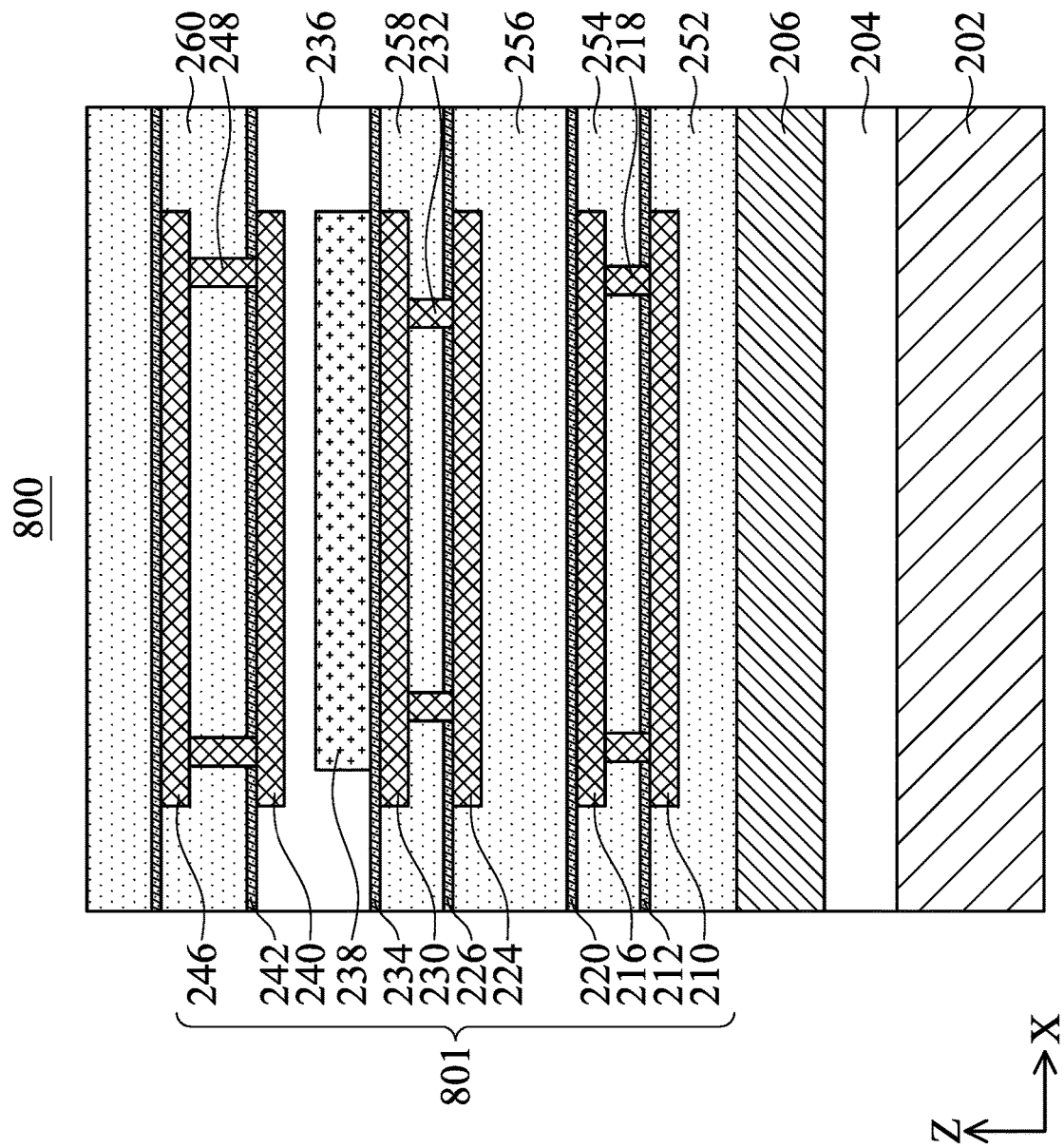

FIG. 8 is a cross-sectional side view of a further exemplary semiconductor structure 800, including an interconnection structure 801, in accordance with some embodiments. The structure and materials of layers of semiconductor structure 800 are similar to those of semiconductor structure 700. The difference of semiconductor structure 800 is the material and the manufacturing processes of dielectric layer 236 having resistor device 238 formed therein instead of dielectric layer 250 having resistor device 238 formed therein. In some embodiments, the structure and materials of resistor device 238 in FIG. 8 may be the same or similar to resistor device 238 in FIG. 12.

As shown in FIG. 8, dielectric layer 236 is formed over ESL 234. Dielectric layer 236 may include an ILD layer. In some embodiments, dielectric layer 236 may include a $SiC_xN_y$ based ILD layer. For example, dielectric layer 236 may include carbon doped $Si_3N_4$. For another example, dielectric layer 236 may be $SiBC_xN_y$. In some embodiments, dielectric layer 236 may have a k-value between 2.0 and 5.0. In some embodiments, dielectric layer 236 may have a k-value between 3.5 and 5.0. In some embodiments, dielectric layer 236 may be formed at a deposition temperature between 150 degrees Celsius and 425 degrees Celsius by CVD, PVD, ALD, spin coating, or other suitable processes. In some embodiments, dielectric layer 236 may be formed with or without additional anneal or UV curing process. In some embodiments, $Si(CH_3)_4$, $(CH_3)_3SiH$, $NH_3$ and/or $N_2$ may be used as the precursor when forming the $SiC_xN_y$ based ILD layer (dielectric layer 236). Different precursors and process conditions may be utilized when forming the dielectric layer 236 compared to those for the dielectric layer 250.

Dielectric layer 236 includes material having a thermal conductivity between 5 W/mK and 500 W/mK, and therefore can quickly dissipate the heat generated by resistor device 238 to the outside of the component, avoiding the accumulation of heat inside the component. For example, when dielectric layer 236 includes carbon doped $Si_3N_4$, the thermal conductivity of $SiC_xN_y$ may be between 200 W/mK and 400 W/mk, and the k-value may be between 2.0 and 5.0, that not only provides improved thermal conductivity but also has low dielectric constant for the semiconductor devices. Hence, semiconductor structure 800 can greatly improve the reliability and efficiency of the semiconductor devices.

Figure 9:
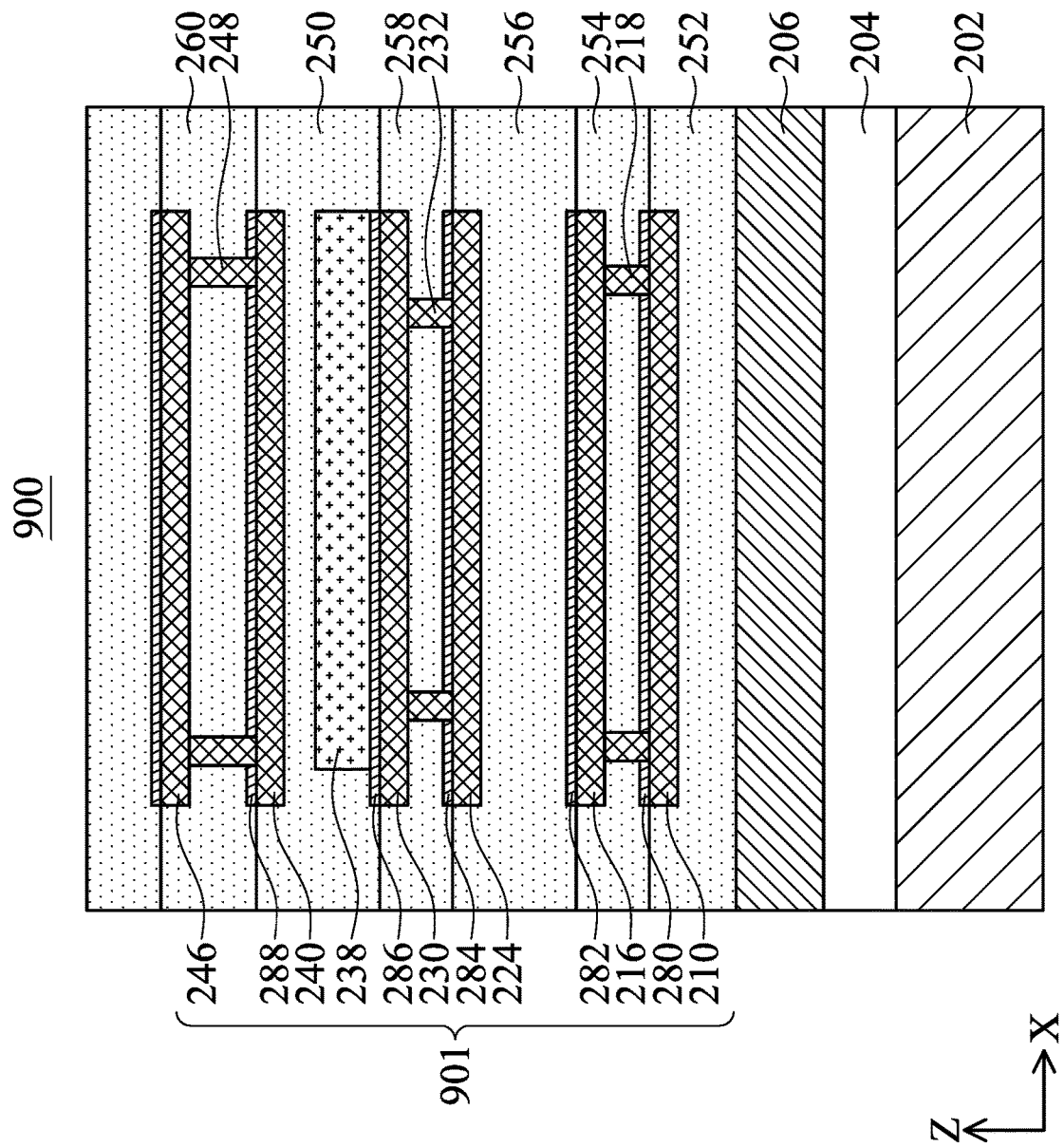

FIG. 9 is a cross-sectional side view of a further exemplary semiconductor structure 900, including an interconnection structure 901, in accordance with some embodiments. The structure and materials of layers of semiconductor structure 900 are similar to those of semiconductor structure 700. The difference of semiconductor structure 900 is that semiconductor structure 900 is an ESL-free structure. Cap layer 280 may be formed over conductive layer 210, as shown in FIG. 9. In some embodiments, cap layer 280 may include graphene. In some embodiments, cap layer 280 may include $Si_xN_y$. In some embodiments, the materials and manufacturing processes of cap layer 280 in semiconductor structure 900 may be similar to cap layer 280 in semiconductor structure 500. In some embodiments, the structure and materials of resistor device 238 in FIG. 9 may be the same or similar to resistor device 238 in FIG. 12.

Figure 10:
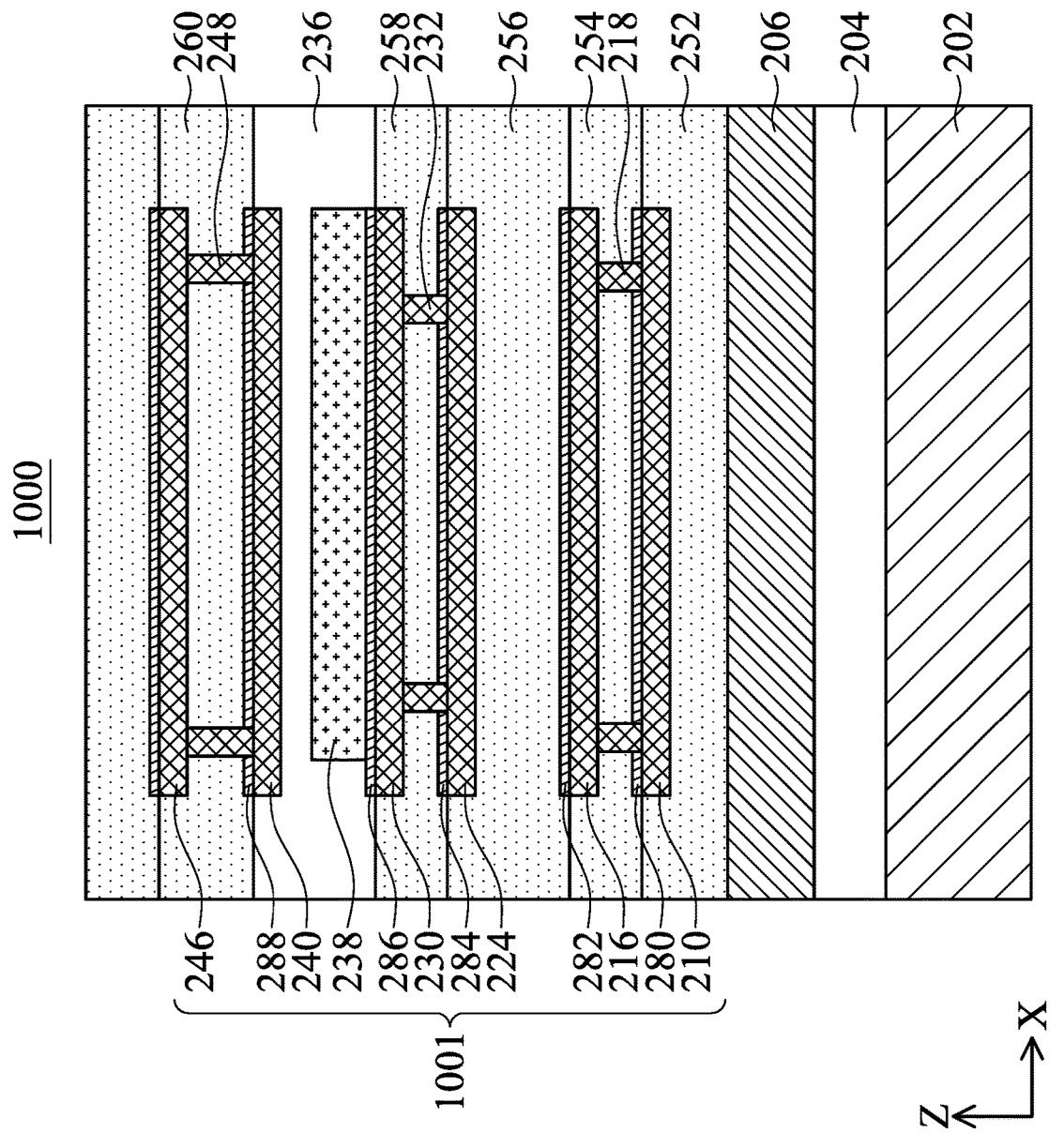

FIG. 10 is a cross-sectional side view of a further exemplary semiconductor structure 1000, including an interconnection structure 1001, in accordance with some embodiments. The structure and materials of layers of semiconductor structure 1000 are similar to those of semiconductor structure 900. Comparing to semiconductor structure 900, the difference of semiconductor structure 1000 is the material and the manufacturing processes of dielectric layer 236 having resistor device 238 formed therein. In some embodiments, the structure and materials of resistor device 238 in FIG. 10 may be the same or similar to resistor device 238 in FIG. 12.

As shown in FIG. 10, dielectric layer 236 is formed over dielectric layer 258 and cap layer 186. Dielectric layer 236 may include an ILD layer. In some embodiments, dielectric layer 236 may include a $SiC_xN_y$ based ILD layer. For example, dielectric layer 236 may include carbon doped $Si_3N_4$. For another example, dielectric layer 236 may be $SiBC_xN_y$. In some embodiments, dielectric layer 236 may have a k-value between 2.0 and 5.0. In some embodiments, dielectric layer 236 may have a k-value between 3.5 and 5.0. In some embodiments, dielectric layer 236 may be formed at a deposition temperature between 150 degrees Celsius and 425 degrees Celsius by CVD, PVD, ALD, spin coating, or other suitable processes. In some embodiments, dielectric layer 236 may be formed with or without additional anneal or UV curing process.

Dielectric layer 236 includes material having a thermal conductivity between 5 W/mK and 500 W/mK, and therefore can quickly dissipate the heat generated by resistor device 238, avoiding the accumulation of heat inside the semiconductor structure 1000. For example, when dielectric layer 236 includes carbon doped $Si_3N_4$, the thermal conductivity of carbon doped $Si_3N_4$ may be between 200 W/mK and 400 W/mK, and the k-value may be between 2.0 and 5.0, that not only provides improved thermal conductivity but also has low dielectric constant for the semiconductor devices. Hence, reliability and efficiency of the semiconductor structure 1000 are improved.

According to embodiments described above, the ILD layers having resistor device 238 formed therein, such as dielectric layer 236 or dielectric layer 250, may help the thermal dissipation of resistor device 238, and therefore the performance of the semiconductor devices may be improved. At the same time, by using the materials and processes in embodiments described above to form the ILD layers, such as dielectric layer 236 or dielectric layer 250, a low k value of the ILD layers may also be maintained.

An embodiment is an interconnection structure. The interconnection structure includes a first dielectric layer, a first conductive layer disposed in the first dielectric layer, a second dielectric layer disposed over the first dielectric layer, a second conductive layer disposed in the second dielectric layer in electrical contact with the first conductive layer, a third dielectric layer formed over the second dielectric layer, wherein the third dielectric layer comprises silicon carbon-nitride (SiCN) based material, and a resistor device disposed in the third dielectric layer.

Another embodiment is an interconnection structure. The interconnection structure includes a first dielectric layer, a first conductive layer disposed in the first dielectric layer, a second dielectric layer disposed over the first dielectric layer, a second conductive layer disposed in the second dielectric layer in electrical contact with the first conductive layer, a third dielectric layer disposed over the second dielectric layer, wherein the third dielectric layer comprises crystalline SiOC based material, and a resistor device disposed in the third dielectric layer.

A further embodiment is a method for forming an interconnection structure. A first dielectric layer is formed on a semiconductor substrate. A first conductive layer is formed in the first dielectric layer. A second dielectric layer is formed over the first dielectric layer. A second conductive layer is formed in the second dielectric layer in electrical contact with the first conductive layer. A third dielectric layer having a thermal conductivity between 5 W/mK and 500 W/mK is formed over the second dielectric layer. A resistor device is formed in the third dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An interconnection structure, comprising:
   a first dielectric layer;
   a first conductive layer disposed in the first dielectric layer;
   a second dielectric layer disposed over the first dielectric layer;
   a second conductive layer disposed in the second dielectric layer in electrical contact with the first conductive layer;
   a third dielectric layer formed over the second dielectric layer, wherein the third dielectric layer has a thermal conductivity between 5 W/mK and 500 W/mK, and the third dielectric layer comprises a material different from the first and second dielectric layers; and
   a resistor device disposed in the third dielectric layer, wherein the resistor device comprises:
      a first silicide blocking layer;
      a first oxide layer disposed on the first silicide blocking layer;
      a high resistance material layer disposed on the first oxide layer;
      a second silicide blocking layer disposed on the high resistance material layer; and
      a second oxide layer disposed on the second silicide blocking layer, wherein an outer sidewall of the high resistance material layer is flush with an outer sidewall of the second oxide layer.

2. The interconnection structure of claim 1, wherein the high resistance material layer comprises TiN or TaN.

3. The interconnection structure of claim 1, wherein the third dielectric layer has a thermal conductivity between 200 W/mk and 400 W/mK.

4. The interconnection structure of claim 3, wherein the third dielectric layer has a k value between 2.0 and 5.0.

5. The interconnection structure of claim 1, further comprising:
   a first cap layer disposed on the first conductive layer; and
   a second cap layer disposed on the second conductive layer, wherein the second dielectric layer is in direct contact with the first dielectric layer, and the third dielectric layer is in direct contact with the second dielectric layer.

6. The interconnection structure of claim 1, wherein the third dielectric layer comprises SiCN based material.

7. An interconnection structure, comprising:
   a first dielectric layer;
   a first conductive layer disposed in the first dielectric layer;

a second dielectric layer disposed over the first dielectric layer, wherein the first dielectric layer and the second dielectric layer comprise crystalline silicon oxycarbide (SiOC) based material;

a second conductive layer disposed in the second dielectric layer in electrical contact with the first conductive layer;

a third dielectric layer formed over the second dielectric layer, wherein the third dielectric layer has a thermal conductivity between 5 W/mK and 500 W/mK, and the third dielectric layer comprises a material different from the first and second dielectric layers; and a resistor device disposed in the third dielectric layer, wherein the resistor device comprises:
a first silicide blocking layer;
a first oxide layer disposed on the first silicide blocking layer;
a high resistance material layer disposed on the first oxide layer;
a second silicide blocking layer disposed on the high resistance material layer; and
a second oxide layer disposed on the second silicide blocking layer, wherein an outer sidewall of the high resistance material layer is flush with an outer sidewall of the second oxide layer.

8. The interconnection structure of claim 7, further comprising:
a first etch stop layer disposed between the second dielectric layer and the first dielectric layer; and
a second etch stop layer disposed between the third dielectric layer and the second dielectric layer.

9. The interconnection structure of claim 7, further comprising:
a first cap layer disposed on the first conductive layer; and
a second cap layer disposed on the second conductive layer, wherein the second dielectric layer is in direct contact with the first dielectric layer, and the third dielectric layer is in direct contact with the second dielectric layer.

10. The interconnection structure of claim 9, wherein the first cap layer and the second cap layer comprise graphene.

11. The interconnection structure of claim 9, wherein the first cap layer and the second cap layer comprise silicon nitride.

12. The interconnection structure of claim 7, wherein the third dielectric layer comprises SiCN based material.

13. The interconnection structure of claim 7, wherein the high resistance material layer comprises TiN or TaN.

14. The interconnection structure of claim 7, wherein the third dielectric layer has a k value between 2.0 and 5.0.

15. The interconnection structure of claim 7, further comprising:
a first cap layer disposed on the first conductive layer; and
a second cap layer disposed on the second conductive layer, wherein the second dielectric layer is in direct contact with the first dielectric layer, and the third dielectric layer is in direct contact with the second dielectric layer.

16. A method for forming an interconnection structure, comprising:
forming a first dielectric layer on a semiconductor substrate;
forming a first conductive layer in the first dielectric layer;
forming a second dielectric layer over the first dielectric layer;
forming a second conductive layer in the second dielectric layer in electrical contact with the first conductive layer;
forming a third dielectric layer having a thermal conductivity between 5 W/mK and 500 W/mK over the second dielectric layer; and
forming a resistor device in the third dielectric layer, wherein the forming of the resistor device comprises:
depositing a first silicide blocking layer;
depositing a first oxide layer;
depositing a high resistance material layer;
depositing a second silicide blocking layer;
depositing a second oxide layer; and
patterning the first silicide blocking layer, the first oxide layer, the high resistance material layer, the second silicide blocking layer, and the second oxide layer, wherein a sidewall of the first silicide blocking layer, a sidewall of the first oxide layer, a sidewall of the high resistance material layer, a sidewall of the second blocking layer, and a sidewall of the second oxide layer are flush with each other after the patterning.

17. The method of claim 16, wherein the third dielectric layer comprises SiCN based material or crystalline SiOC based material.

18. The method of claim 16, further comprising:
forming a first cap layer on the first conductive layer; and
forming a second cap layer on the second conductive layer, wherein the second dielectric layer is in direct contact with the first dielectric layer, and the third dielectric layer is in direct contact with the second dielectric layer.

19. The method of claim 18, further comprising:
selectively depositing the first cap layer on the first conductive layer; and
selectively depositing the second cap layer on the second conductive layer.

20. The method of claim 16, wherein the high resistance material layer comprises TiN or TaN.

* * * * *